United States Patent
Butt et al.

(10) Patent No.: US 7,215,584 B2
(45) Date of Patent: May 8, 2007

(54) METHOD AND/OR APPARATUS FOR TRAINING DQS STROBE GATING

(75) Inventors: Derrick Sai-Tang Butt, San Leandro, CA (US); Hui-Yin Seto, San Jose, CA (US)

(73) Assignee: LSI Logic Corporation, Milpitas, CA (US)

(*) Notice: Subject to any disclaimer, the term of this patent is extended or adjusted under 35 U.S.C. 154(b) by 159 days.

(21) Appl. No.: 11/173,529

(22) Filed: Jul. 1, 2005

(65) Prior Publication Data

US 2007/0002642 A1    Jan. 4, 2007

(51) Int. Cl.
*G11C 7/00* (2006.01)

(52) U.S. Cl. ............... 365/193; 365/194; 365/233

(58) Field of Classification Search ........... 365/201, 365/193, 194, 233, 190, 202; 711/154, 167, 711/40
See application file for complete search history.

(56) References Cited

U.S. PATENT DOCUMENTS

| | | | |
|---|---|---|---|
| 6,600,681 B1* | 7/2003 | Korger et al. ............... 365/193 |
| 6,680,866 B2* | 1/2004 | Kajimoto ............... 365/189.01 |
| 6,715,096 B2* | 3/2004 | Kuge ............... 713/600 |
| 7,057,934 B2* | 6/2006 | Krishnamachari et al. ............... 365/185.19 |
| 2004/0066870 A1* | 4/2004 | Gabara et al. ............... 375/354 |
| 2007/0008791 A1* | 1/2007 | Butt et al. ............... 365/193 |

* cited by examiner

*Primary Examiner*—Son Dinh
*Assistant Examiner*—Hien N Nguyen
(74) *Attorney, Agent, or Firm*—Christopher P. Maiorana, P.C.

(57) ABSTRACT

A method for calibrating read data strobe gating including the steps of: (A) performing a coarse timing adjustment configured to determine a coarse delay setting that produces invalid data, (B) performing a medium timing adjustment configured to adjust a medium delay setting and the coarse delay setting until valid data is detected, (C) performing a fine timing adjustment configured to adjust the medium delay setting and a fine delay setting until valid data is detected and (D) adding one-half cycle to a gating delay determined by the coarse, the medium and the fine delay settings.

20 Claims, 16 Drawing Sheets

200

202
INITIALIZE SYSTEM FOR READ GATE TIMING CALIBRATION

204
PERFORM COARSE READ GATE TIMING ADJUSTMENT

206
PERFORM MEDIUM READ GATE TIMING ADJUSTMENT

208
PERFORM FINE READ GATE TIMING ADJUSTMENT

210
SET READ GATE TIMING DELAY

212
END

FIG. 8

METHOD AND/OR APPARATUS FOR TRAINING DQS STROBE GATING

CROSS REFERENCE TO RELATED APPLICATIONS

The present application may relate to co-pending U.S. application Ser. No. 11/097,903, filed Apr. 1, 2005, U.S. application Ser. No. 11/154,401, filed Jun. 16, 2005, and U.S. application Ser. No. 11/166,292, filed Jun. 24, 2005, which are each hereby incorporated by reference in their entirety.

FIELD OF THE INVENTION

The present invention relates to memory systems generally and, more particularly, to a method and/or apparatus for training DQS strobe gating that may be suitable for a DDR memory application.

BACKGROUND OF THE INVENTION

A double data rate (DDR) synchronous dynamic random access memory (SDRAM) interface receives aligned data (DQ) and read data strobe (DQS) signals from a DDR SDRAM device. The DDR SDRAM interface is responsible for providing the appropriate DQ-DQS relationship. A conventional approach performs system-level timing analysis using a simulation program for integrated circuit emphasis (SPICE) to determine a timing that yields adequate setup and hold time margin within a data valid window. The conventional approach is not programmable and can vary for different hardware implementations. The conventional approach does not calibrate the actual data valid window in silicon. The conventional approach relies heavily on the pre-silicon, system-level, SPICE timing analysis.

It would be desirable to have a method for training read data strobe gating.

SUMMARY OF THE INVENTION

The present invention concerns a method for calibrating read data strobe gating including the steps of: (A) performing a coarse timing adjustment configured to determine a coarse delay setting that produces invalid data, (B) performing a medium timing adjustment configured to adjust a medium delay setting and the coarse delay setting until valid data is detected, (C) performing a fine timing adjustment configured to adjust the medium delay setting and a fine delay setting until valid data is detected and (D) adding one-half cycle to a gating delay determined by the coarse, the medium and the fine delay settings.

The objects, features and advantages of the present invention include providing a read data strobe (DQS) gating training method and/or apparatus that may (i) provide a systematic process for calibrating the center of a preamble period without going through detail system level SPICE timing analysis, (ii) enable an upper level memory controller function to perform run time calibration of the preamble period, (iii) provide a process that is flexible and adaptable to various different system implementations and/or (iv) eliminate reliance on a system level, pre-silicon, SPICE timing analysis on the data valid window.

BRIEF DESCRIPTION OF THE DRAWINGS

These and other objects, features and advantages of the present invention will be apparent from the following detailed description and the appended claims and drawings in which:

FIG. 8 is a flow diagram of a process in accordance with a preferred embodiment of the present invention;

DETAILED DESCRIPTION OF THE PREFERRED EMBODIMENTS

Figure 1:
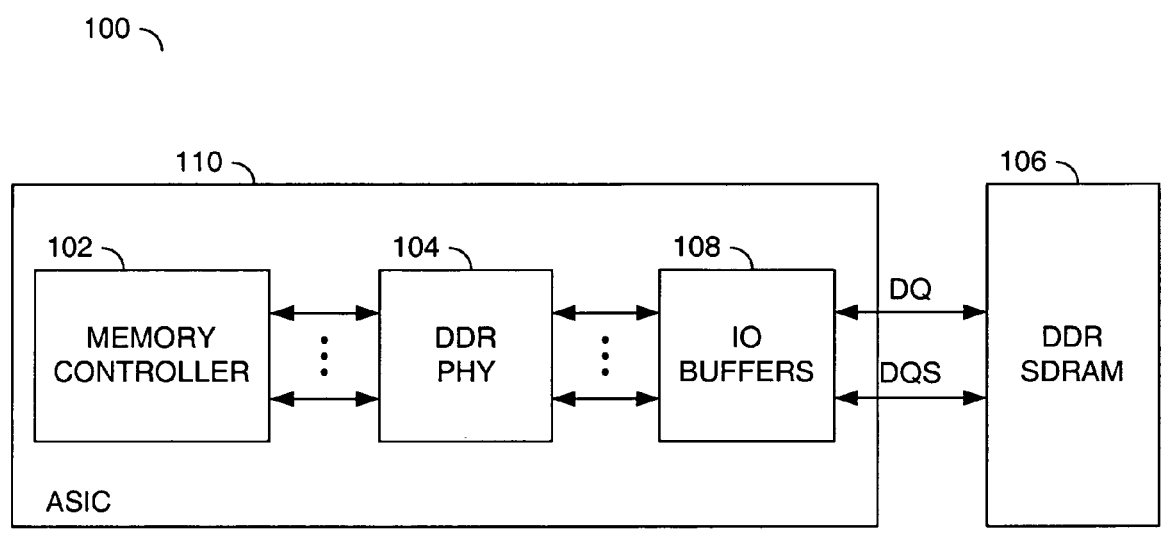
FIG. 1 is a block diagram illustrating a memory system in which an embodiment of the present invention may be implemented.

Referring to FIG. 1, a block diagram is shown illustrating a system 100 in which one or more preferred embodiments of the present invention may be implemented. In one example, the system 100 may comprise a circuit (or block) 102, a circuit (or block) 104, a circuit (or block) 106 and a circuit (or block) 108. The circuit 102 may be implemented as a memory controller. The circuit 104 may be implemented as a memory interface. In one example, the circuit 104 may be implemented as a double data rate (DDR) physical layer (PHY) core. The circuit 106 may be implemented as one or more double data rate (DDR) synchronous dynamic random access memory (SDRAM) devices. The circuit 108 may be implemented, in one example, as stub series terminated logic (SSTL) IO buffers. The circuit 104 may be coupled between the circuit 102 and the circuit 106. In one example, the circuit 104 may be coupled to the circuit 106 by the circuit 108. The circuit 104 may be configured to receive a plurality of data signals (e.g., DQ) and a plurality of read data strobe signals (e.g., DQS). In one example, the plurality of read data strobe signals may comprise a single read data strobe for each byte of the signals DQ. In another example (e.g., an x4 mode), the plurality of data strobe signals DQS may comprise a separate strobe signal (e.g., DQS_UN and DQS_LN, respectively) for each nibble (e.g., upper and lower) of the signal DQ.

In one example, the circuits 102, 104 and 108 may be implemented (or instantiated) on an application specific integrated circuit (ASIC) 110. However, the circuit 102 may be implemented separately and mounted on a common printed circuit board (PCB) along with the circuits 104, 106 and 108. The ASIC 110 may be implemented, in one example, as a platform (or structured) ASIC. In one example, the circuit 104 may be implemented based on diffused datapath (DP) and master delay modules. In another example, the circuit 104 may be implemented based on R-cell datapath and master delay modules. In one example, the circuit 104 may be implemented in an R-cell transistor fabric of the ASIC 110. As used herein, R-cell generally refer to an area of silicon containing one or more diffusions for forming the parts of N and/or P type transistors and the contact points where wires may be attached in subsequent manufacturing steps (e.g., to power, ground, inputs and outputs). Wire layers may be added to the R-cell transistor fabric to make particular transistors, logic gates, soft and firm IP blocks and/or storage elements.

Figure 2:
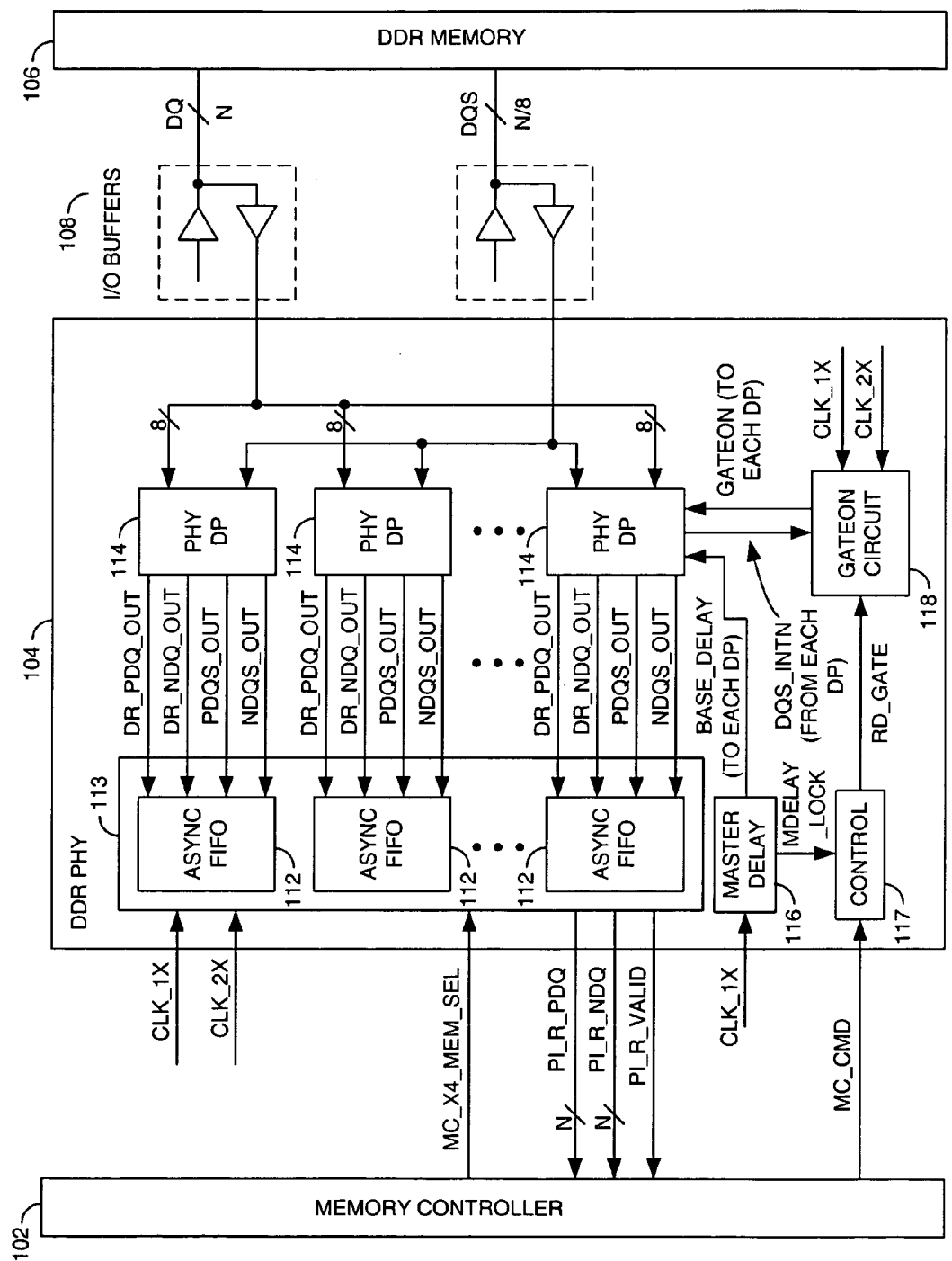
FIG. 2 is a more detailed block diagram of a read data logic and signal paths of a memory interface of FIG. 1.

Referring to FIG. 2, a more detailed block diagram of the circuit 104 is shown illustrating example read data logic and signal paths in which a preferred embodiment of the present invention may be implemented. In one example, the circuit 104 may comprise a number of asynchronous (ASYNC) first-in first-out (FIFO) buffers 112, FIFO synchronization logic 113, a number of physical read datapaths (DPs) 114, a master delay (MDELAY) logic 116, a control logic 117 and a programmable gating signal generator 118. Each of the physical read datapaths 114 may be configured to receive (i) a respective portion of the read data signals DQ from the DDR memory 106, (ii) a respective read data strobe signal or signals DQS associated with the respective portion of the received read data signals and (iii) a gating signal (e.g., GATEON) from the programmable gating signal generator 118. Each of the physical read datapaths 114 may communicate with a corresponding one of the asynchronous FIFOs 112 via a number of signals (e.g., DR_PDQ_OUT, DR_NDQ_OUT, PDQS_OUT, and NDQS_OUT). In one example, separate signals (e.g., PDQS_OUT_UN, NDQS_OUT_UN, PDQS_OUT_LN, and NDQS_OUT_LN) may be generated for each nibble of the DPs 114. In one example, the asynchronous FIFOs 112 may be configured to interface the physical read datapaths 114 with the memory controller 102.

In general, the signals DQ and DQS may be presented to the DDR PHY 104 on a number of buses. The signals DQ and DQS may be broken out to multiple instantiations of DP hardmacros. The DPs may be configured via internal settings to delay the read data strobe signals DQS based on one or more control signals (or values) from the MDELAY circuit 116. Each of the DPs 114 may be configured to present the DQ data to a respective asynchronous FIFO 112 via the signals DR_PDQ_OUT and DR_NDQ_OUT, after the data is sampled using the delayed read data strobe signals DQS.

The FIFOs 112 are generally configured to transfer the read data DQ from the read data strobe (or DQS) domain to the CLK_1X domain for presentation to the memory controller 102. The read data DR_PDQ_OUT and DR_NDQ_OUT are generally written to the FIFOs 112 in response to (e.g., clocked by) the signals PDQS_OUT and NDQS_OUT, respectively). The memory controller 102 may be configured to read the data DQ (e.g., via signals PI_R_PDQ and PI_R_NDQ) from the FIFOs 112 in response to the clock signal CLK_1X. In one example, the FIFOs 112 may be implemented as eight words deep.

As briefly described above, the read datapaths 114 are generally programmable from when the data/strobe pairs DQ/DQS are received at the input to the circuit 104, to sampling the read data with the read data strobe signal DQS, and passing the data to the memory controller 102. The programmability of the read datapaths 114 generally provides flexibility for handling different column address strobe (CAS) latencies, burst lengths, device process variation, and/or propagation delays.

The master delay (MDELAY) logic 116 is generally configured to calculate a delay value for generating a one-quarter cycle or one-fifth cycle delay with respect to the device reference clock (e.g., the signal CLK_LX). The calculated delay is generally used by the datapaths 114 to center a read data capture clock (e.g., the signal DQS) in a valid DDR device read data window. The calculated delay generally tracks process, voltage and temperature (PVT) corners for reliable read data latching. The MDELAY logic may be configured to generate the one-quarter cycle or one-fifth cycle delay using a delay lock loop (DLL). Once the DLL is locked to the clock signal CLK_LX, a signal (e.g., MDELAY_LOCK) may be generated indicating the locked state. The signal MDELAY_LOCK may be presented to an input of the control logic 117 and/or the memory controller 102.

The MDELAY logic 116 may be configured to generate one or more control signals (or values) for transferring the delay settings (or values) to one or more slave delay cells (describe in more detail in connection with FIGS. 3A and 3B) in each of the DPs 114. The delay values, when transferred to each of the DPs 114, are generally referred to as base delays. In one example, a base delay may be implemented for each nibble of each DP byte. For example, a first base delay value (e.g., BASE_DELAY_UN) may be implemented for each upper nibble and a second base delay value (e.g., BASE_DELAY_LN) may be implemented for each lower nibble. The DPs 114 may also be programmed with offset delay values corresponding to each nibble (e.g., OFFSET_P_UN, OFFSET_N_UN, OFFSET_P_LN and OFFSET_N_LN). In one example, each of the DPs 114 may have a set of base delays that are independent of the other DPs 114. The offset delay values may be added to or subtracted from the respective base delay values.

The control circuit 117 may be configured to generate one or more control signals for controlling and/or configuring the FIFOs 112 and datapaths 114. In one example, the control circuit 117 may be configured to generate a gating signal (e.g., RD_GATE) in response to a signal (e.g., MC_CMD) received from the controller 102. In one example, the circuit 117 may be configured to generate the signal RD_GATE in response to decoding a READ command in the signal MC_CMD. The signal RD_GATE is generally configured to prevent invalid states (e.g., when DQS is in a 3-state, or OFF, mode) from entering the circuit 113. The signal RD_GATE may be used to generate one or more gating signals.

The programmable gateon generating circuit 118 may be configured to generate the signal GATEON in response to the signal RD_GATE, a first clock signal (e.g., CLK_LX), a second clock signal (e.g., CLK_2X) and a data strobe signal (e.g., DQS_INTN) received from the DPs 114. The signal GATEON may be used to gate the read data strobe signal DQS received from the memory device 106. In one example, separate gating signals (e.g., GATEON_UN, GATEON_LN, etc.) may be generated for each nibble of the DPs 114. The signal DQS_INTN may be used to de-assert the signal GATEON. In one example, separate signals (e.g., DQS_INTN_UN and DQS_INTN_LN) may be generated for each nibble of the DPs 114. Although the circuit 118 is shown implemented separately from the DPs 114, it will be understood by those skilled in the art that the circuit 118 may be implemented as part of the DPs 114 (e.g., the signal GATEON may be generated within the DPs 114 or external to the DPs 114).

Figure 3A:
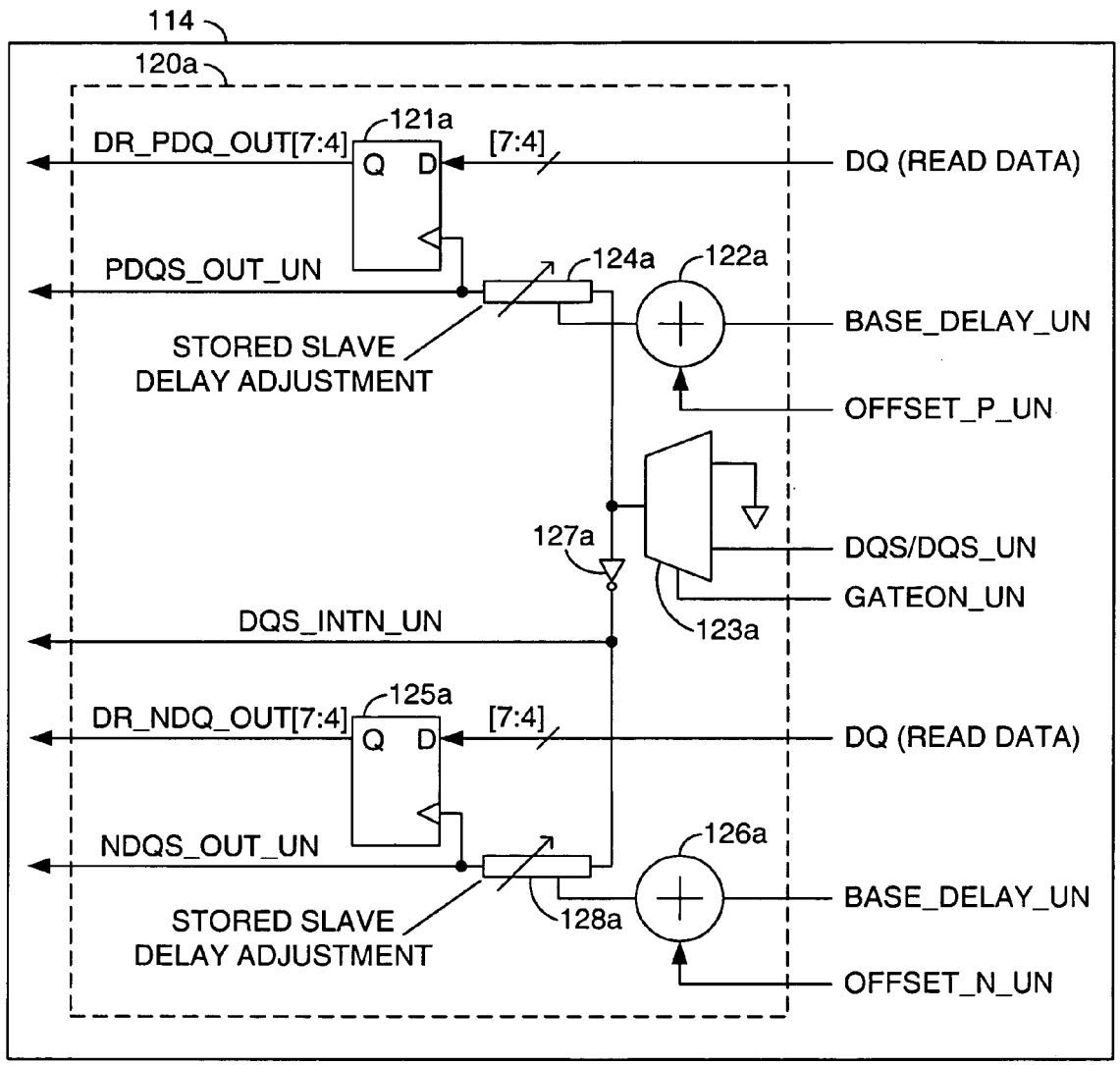
FIGS. 3(A–B) are more detailed block diagrams illustrating details of read data latching and gating.
Figure 3B:
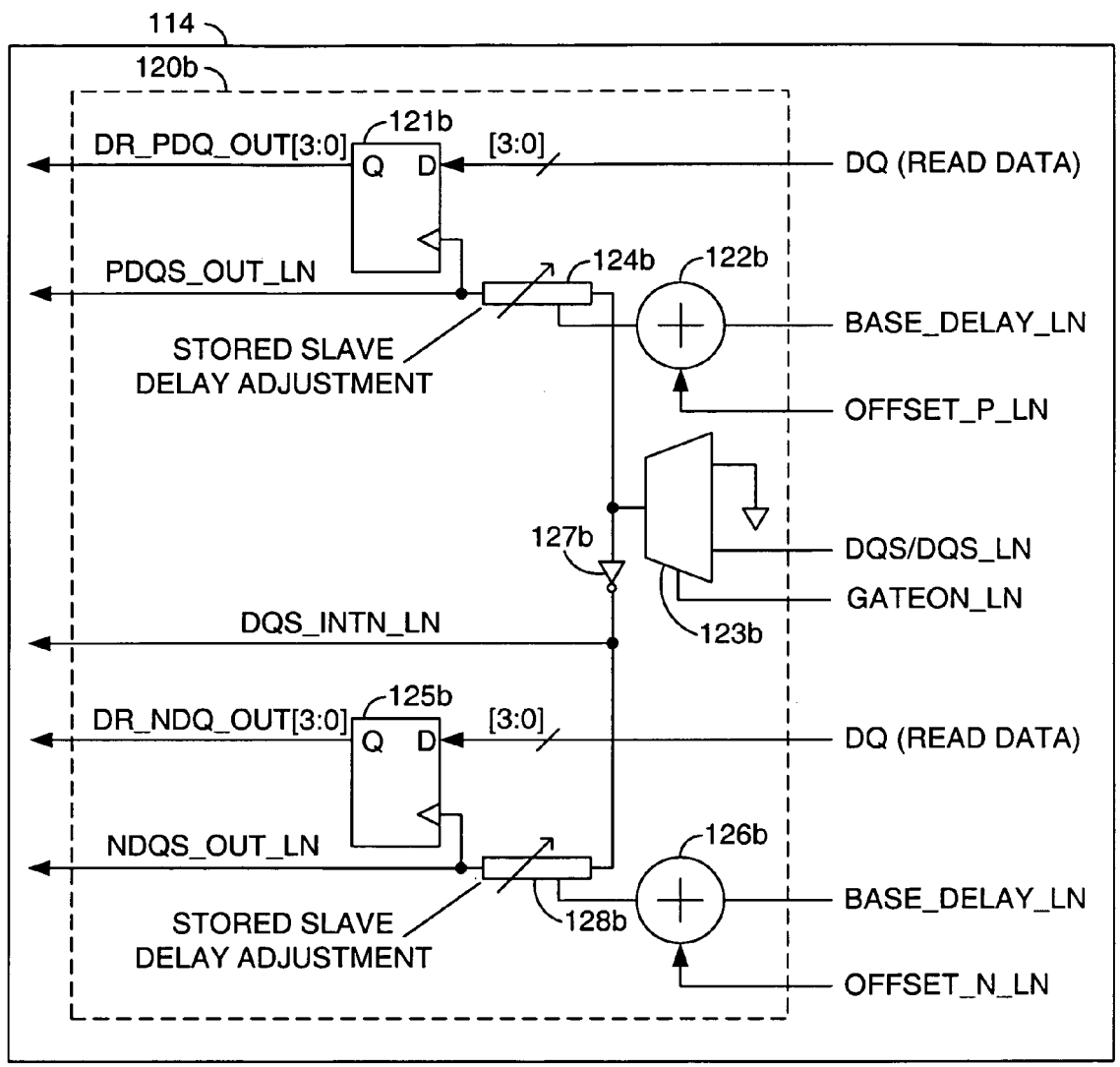

Referring to FIGS. 3(A–B), more detailed block diagrams of a datapath 114 of FIG. 2 are shown illustrating an example read data latching and gating circuit in accordance with a preferred embodiment of the present invention. In one example, each datapath 114 may comprise an upper nibble pathway 120a (FIG. 3A) and a lower nibble pathway 120b (FIG. 3B). The upper nibble pathway 120a may have a first input that may receive a number of bits of the signal DQ (e.g., bits 7:4), a second input that may receive the signal BASE_DELAY_UN, a third input that may receive the signal OFFSET_P_UN, a fourth input that may receive the signal OFFSET_N_UN, a fifth input that may receive the signal DQS (or the signal DQS_UN in the x4 mode), a sixth input that may receive a signal (e.g., GATEON_UN). The upper nibble pathway 120a may also have a first output that may present a number of bits (e.g., the signal DR_PDQ_OUT[7:4]), a second output that may present a number of bits (e.g., the signal DR_NDQ_OUT[7:4]), a third output that may present a signal (e.g., PDQS_OUT_UN), a fourth output that may present a signal (e.g., NDQS_OUT_UN) and a fifth output that may present a signal (e.g., DQS_INTN_UN).

The upper nibble pathway 120a may comprise a circuit (or block) 121a, a circuit (or block) 122a, a circuit (or block) 123a, a circuit (or block) 124a, a circuit (or block) 125a, a circuit (or block) 126a, a circuit (or block) 127a and a circuit (or block) 128a. The circuit 121a may be implemented as one or more registers. The circuit 122a may be implemented as an adder block. The circuit 123a may be implemented as a multiplexer circuit. The circuit 124a may be implemented as a slave delay adjustment block. The circuit 125a may be implemented as one or more registers. The circuit 126a may be implemented as an adder block. The circuit 127a may be implemented as an inverter circuit. The circuit 128a may be implemented as a slave delay adjustment block.

The circuit 121a may be configured to latch an upper nibble (e.g., bits 7:4) of the read data signal DQ in response to a clock input. The circuit 121a may be further configured to present the latched read data as the signal DR_PDQ_OUT[7:4]. The circuit 122a may be configured to generate a sum (or difference) of the signals BASE_DELAY_UN and OFFSET_P_UN. The circuit 123a may be configured to select either the signal DQS (or the signal DQS_UN in the x4 mode) or a predetermined logic level (e.g., a LOW or logic 0) in response to the signal GATEON_UN. The circuit 124a may be configured to delay the signal presented by the circuit 123a based on the sum (or difference) generated by the circuit 122a. An output of the circuit 124a may present the signal PDQS_OUT_UN to the clock input of the circuit 121a and the third output of the upper nibble pathway 120a.

The circuit 125a may be configured to latch an upper nibble (e.g., bits 7:4) of the read data signal DQ in response to a clock input. The circuit 125a may be further configured to present the latched read data as the signal DR_NDQ_OUT[7:4]. The circuit 126a may be configured to generate a sum (or difference) of the signals BASE_DELAY_UN and OFFSET_N_UN. The circuit 127a may be configured to generate the signal DQS_INTN_UN as a digital complement of the signal presented by the circuit 123a. The signal DQS_INTN_UN may be presented to an input of the circuit 128a and the fifth output of the upper nibble pathway 120a. The circuit 128a may be configured to generate the signal NDQS_OUT_UN by delaying the signal DQS_INTN_UN based on the sum (or difference) generated by the circuit 126a. An output of the circuit 128a may present the signal NDQS_OUT_UN to the clock input of the circuit 125a and the fourth output of the upper nibble pathway 120a.

The lower nibble pathway 120b may have a first input that may receive a number of bits (e.g., bits 3:0) of the signal DQ, a second input that may receive the signal BASE_DELAY_LN, a third input that may receive the signal OFFSET_P_LN, a fourth input that may receive the signal OFFSET_N_LN, a fifth input that may receive the signal DQS (or the signal DQS_LN in the x4 mode), a sixth input that may receive a signal (e.g., GATEON_LN). The lower nibble pathway 120b may also have a first output that may present a number of bits (e.g., the signal DR_PDQ_OUT[3:0]), a second output that may present a number of bits (e.g., the signal DR_NDQ_OUT[3:0]), a third output that may present the signal PDQS_OUT_LN, a fourth output that may present the signal NDQS_OUT_LN and a fifth output that may present the signal DQS_INTN_LN.

The lower nibble pathway 120b may comprise a circuit (or block) 121b, a circuit (or block) 122b, a circuit (or block) 123b, a circuit (or block) 124b, a circuit (or block) 125b, a circuit (or block) 126b, a circuit (or block) 127b and a circuit (or block) 128b. The circuit 121b may be implemented as one or more registers. The circuit 122b may be implemented as an adder block. The circuit 123b may be implemented as a multiplexer circuit. The circuit 124b may be implemented as a slave delay adjustment block. The circuit 125b may be implemented as one or more registers. The circuit 126b may be implemented as an adder block. The circuit 127b may be implemented as an inverter circuit. The circuit 128b may be implemented as a slave delay adjustment block.

The circuit 121b may be configured to latch a lower nibble (e.g., bits 3:0) of the read data signal DQ in response to a clock input. The circuit 121b may be further configured to present the latched read data as the signal DR_PDQ_OUT[3:0]. The circuit 122b may be configured to generate a sum (or difference) of the signals BASE_DELAY_LN and OFFSET_P_LN. The circuit 123b may be configured to select either the signal DQS (or the signal DQS LN in the x4 mode) or a predetermined logic level (e.g., a LOW or logic 0) in response to the signal GATEON_LN. The circuit 124b may be configured to delay the signal presented by the circuit 123b based on the sum (or difference) generated by the circuit 122b. An output of the circuit 124b may present the signal PDQS_OUT_LN to the clock input of the circuit 121b and the third output of the lower nibble pathway 120b.

The circuit 125b may be configured to latch a lower nibble (e.g., bits 3:0) of the read data signal DQ in response to a clock input. The circuit 125b may be further configured to present the latched read data as the signal DR_NDQ_OUT[3:0]. The circuit 126b may be configured to generate a sum (or difference) of the signals BASE_DELAY_LN and OFFSET_N_LN. The circuit 127b may be configured to generate the signal DQS_INTN_LN as a digital complement of the signal presented by the circuit 123b. The signal DQS_INTN_LN may be presented to an input of the circuit 128b and the fifth output of the lower nibble pathway 120b. The circuit 128b may be configured to generate the signal NDQS_OUT_LN by delaying the signal DQS_INTN_LN based on the sum (or difference) generated by the circuit 126b. An output of the circuit 128b may present the signal NDQS_OUT_LN to the clock input of the circuit 125b and the fourth output of the lower nibble pathway 120b.

Figure 4:
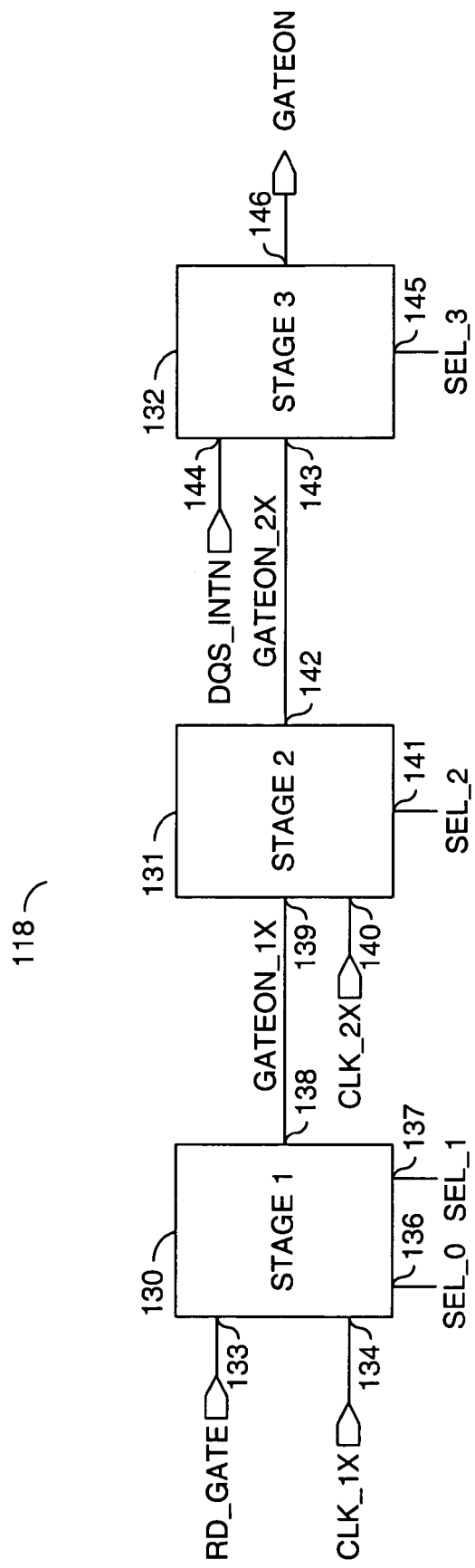
FIG. 4 is a block diagram illustrating a programmable gating signal generating circuit in accordance with a preferred embodiment of the present invention.

Referring to FIG. 4, a more detailed block diagram of the circuit 118 of FIG. 2 is shown in accordance with a preferred embodiment of the present invention. The circuit 118 generally comprises a block (or circuit) 130, a block (or circuit) 131 and a block (or circuit) 132. The circuit 130 may be implemented as a first stage. The circuit 131 may be implemented as a second stage. The circuit 132 may be implemented as a third stage. The first stage 130 may have an input 133 that may receive the signal RD_GATE, an input 134 that may receive the signal CLK_1X, an input 136 that may receive a select signal (e.g., SEL_0) and an input 137 that may receive another select signal (e.g., SEL_1). The signal CLK_1X may be implemented as a single speed clock signal. The first stage 130 may have an output 138 that may present a signal (e.g., GATEON_1X) to an input 139 of the second stage 131.

The second stage 131 may also have an input 140 that may receive the signal CLK_2X. The signal CLK_2X may be implemented as a double speed clock signal. The signal CLK_2X may be a multiple (e.g., 2X) of the signal CLK_1X. The circuit 131 may have a third input 141 that may receive a select signal (e.g., SEL_2) and an output 142 that may present a signal (e.g., GATEON_2X) to an input 143 of the third stage 132. The third stage 132 may also have an input 144 that may receive the signal DQS_INTN, an input 145 that may receive a select signal (e.g., SEL_3) and an output 146 that may present the signal GATEON. In one example, the select signals SEL_0, SEL_1, SEL_2 and SEL_3 may be implemented as one or more bits of a multi-bit select signal having a value determined by a delay value for the signal GATEON.

The signal RD_GATE is generally asserted (e.g., "HIGH", or a logic "1") in response to a READ command issued by the memory controller 102. The signal RD_GATE is generally held HIGH by the control circuit 117 for the entire burst of read operations. For example, for a read burst of 8, the signal RD_GATE will generally be held HIGH for four clock cycles of the signal CLK_1X.

The stages 130, 131 and 132 are generally configured to provide three sets of delay adjustments (e.g., coarse, medium, and fine delays) with different granularities (e.g., 1, ¼, and 1/32 of a 1x clock cycle). The three sets of delay adjustments may provide adjustment for variations within the system 100 (e.g., CAS latency, I/O buffer delays, PCB flight time, cross-point skews of memory clocks, etc.). Other granularities may be implemented to meet the design criteria of a particular implementation. The circuit 118 is normally implemented as a self-timed circuit. The last falling edge of a data strobe signal (e.g., DQS) will turn off a read DQS path.

The data strobe signal DQS is normally implemented as a bidirectional signal. Noise or unwanted signal toggling may propagate into the memory controller 102 when the controller is not actively reading data from the memory device. To avoid unwanted noise, or false propagating of the signal DQS into the controller 102, the signal GATEON in each DP 114 may be configured to gate off the paths. It is generally desirable to gate off the read data strobe DQS path when the memory controller 102 is not reading from the memory circuit 106.

Figure 5:
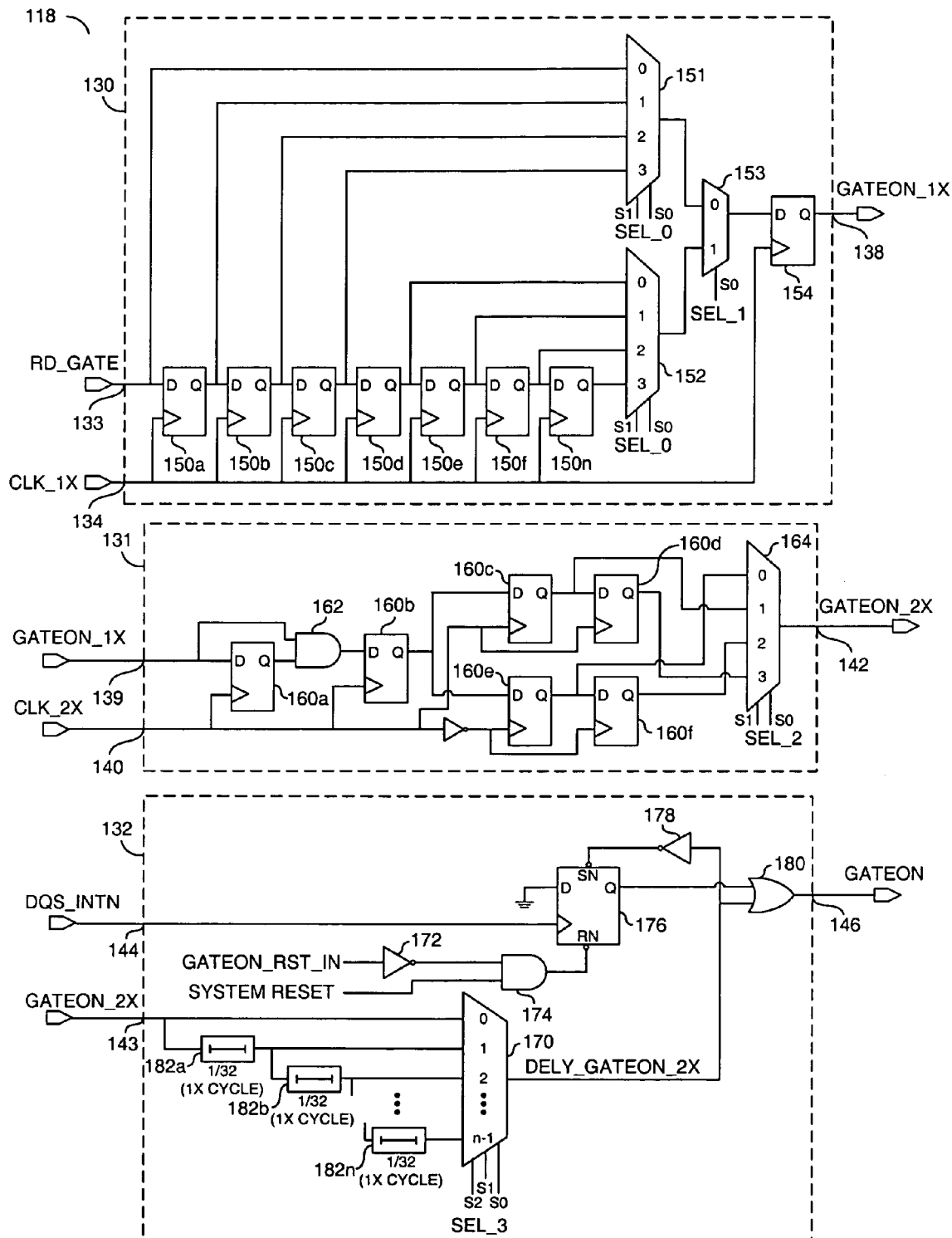
FIG. 5 is a more detailed diagram of the programmable gating signal generating circuit of FIG. 4.

Referring to FIG. 5, a more detailed diagram of the circuit 118 is shown. FIG. 5 generally illustrates an example of a programmable gateon circuit that may be implemented to control gating of the signal DQS during the pre- and post-amble phase of the read cycle. The first stage 130 generally comprises a number of flip-flops 150a–150n, a multiplexer 151, a multiplexer 152, a multiplexer 153 and a flip-flop 154. Each of the flip-flops 150a–150n generally delays the signal RD_GATE by one clock cycle. Each of the flip-flops 150a–150n are normally clocked by the clock signal CLK_1X. The multiplexer 151 has a number of inputs (e.g., labeled 0–3) that each receive a corresponding output from the flip-flops 150a–150c. For example, the input 0 may directly receive the signal RD_GATE. The input 1 may receive a signal from the flip-flop 150a, the input 2 may receive a signal from the flip-flop 150b and the input 3 may receive a signal from the flip-flop 150c.

Similarly, the multiplexer 152 has a number of inputs (e.g., labeled 0–3) that may receive signals from the flip-flops 150d–150n. For example, the input 0 may receive a signal from the flip-flop 150d. The input 1 may receive a signal from the flip-flop 150e, the input 2 may receive a signal from the flip-flop 150f and the input 3 may receive a signal from the flip-flop 150n. The particular number of flip-flops 150a–150n may be varied to meet the design criteria of a particular implementation. Additionally, the multiplexers 151 and 152 may implement with a greater number or a lesser number of inputs to meet the design criteria of a particular implementation. The select signal SEL_0 (e.g., first and second bits of a multi-bit select signal) generally presents signals to a select input S0 and a select input S1 of the multiplexer 151 and the multiplexer 152. The select inputs S0 and S1 generally control which of the inputs 0–3 is presented at the output of the multiplexer 151 and the multiplexer 152.

The multiplexer 153 generally has a first input (e.g., 0) that receives a signal from the multiplexer 151 and a second input (e.g., 1) that receives a signal from the multiplexer 152. The multiplexer 153 has a select signal (e.g., S0), that may receive the signal SEL_1 (e.g., a third bit of the multi-bit select signal). The flip-flop 154 receives a signal from an output of the multiplexer 153 and presents the signal GATEON_1X.

The second stage 131 generally comprises a number of flip-flops 160a–160f, a gate 162 and a multiplexer 164. The flip-flops 160a, 160b, 160c, 160d are generally clocked by the clock signal CLK_2X. The flip-flops 160e and 160f are generally clocked by a complement (e.g., 180 degrees out of phase) of the clock signal CLK_2X (e.g., /CLK_2X). The multiplexer 164 has a number of inputs (e.g., labeled 0–3) that receive signals from different flip-flops 160c–160f. The select signal SEL_2 (e.g., fourth and fifth bits of the multi-bit select signal) may be presented to select inputs S0 and S1 of the multiplexer 164. The multiplexer 164 may have an output that may present the signal GATEON_2X.

The third stage 132 generally comprises a multiplexer 170, an inverter 172, a gate 174, a flip-flop 176, an inverter 178, a gate 180 and a number of delay elements 182a–182n. The multiplexer 170 has a number of inputs (e.g., labeled 0 through n−1) that receive different delayed versions of the signal GATEON_2X. The signal GATEON_2X is presented to the input 0 of the multiplexer 170. The signal GATEON_2X is also passed through the delay element 182a, which then goes to the input 1 of the multiplexer 170 and the delay element 182b. An output of the delay element 182b is presented to the input 2 of the multiplexer 170 and a next delay element. The arrangement is repeated for each of the delay elements 182c–182n. An output of the delay element 182n is presented to the input n−1 of the multiplexer 170. In one example, the delay elements 182a–182n may be implemented to provide one thirty-secondth of a clock cycle delay. However, other delays may be implemented to meet the design criteria of a particular implementation.

The select signal SEL_3 (e.g., three more bits of the multi-bit select signal) is presented as the select signals S0, S1 and S2 to a control input of the multiplexer 170. The multiplexer 170 selects one of the input signals for presentation at an output (e.g., as a signal DELY_GATEON_2X) in response to the control input. The signal DELY_GATEON_2X is presented to an input of the inverter 178 and a first input of the gate 180. The signal DELY_GATEON_2X may be a delayed version of the signal GATEON_2X. The inverter 172, the gate 174 and the flip-flop 176 may be configured to generate an output based upon the signal DQS_INTN, a reset signal (e.g., GATEON_RST_IN), a reset signal (e.g., SYSTEM RESET) and an output of the inverter 178. The output of the flip-flop 176 is presented to a second input of the gate 180. In one example, the signal GATEON may be asserted in response to the signal DELY_GATEON_2X and de-asserted in response to the output of the flip-flop 176.

Figure 6:
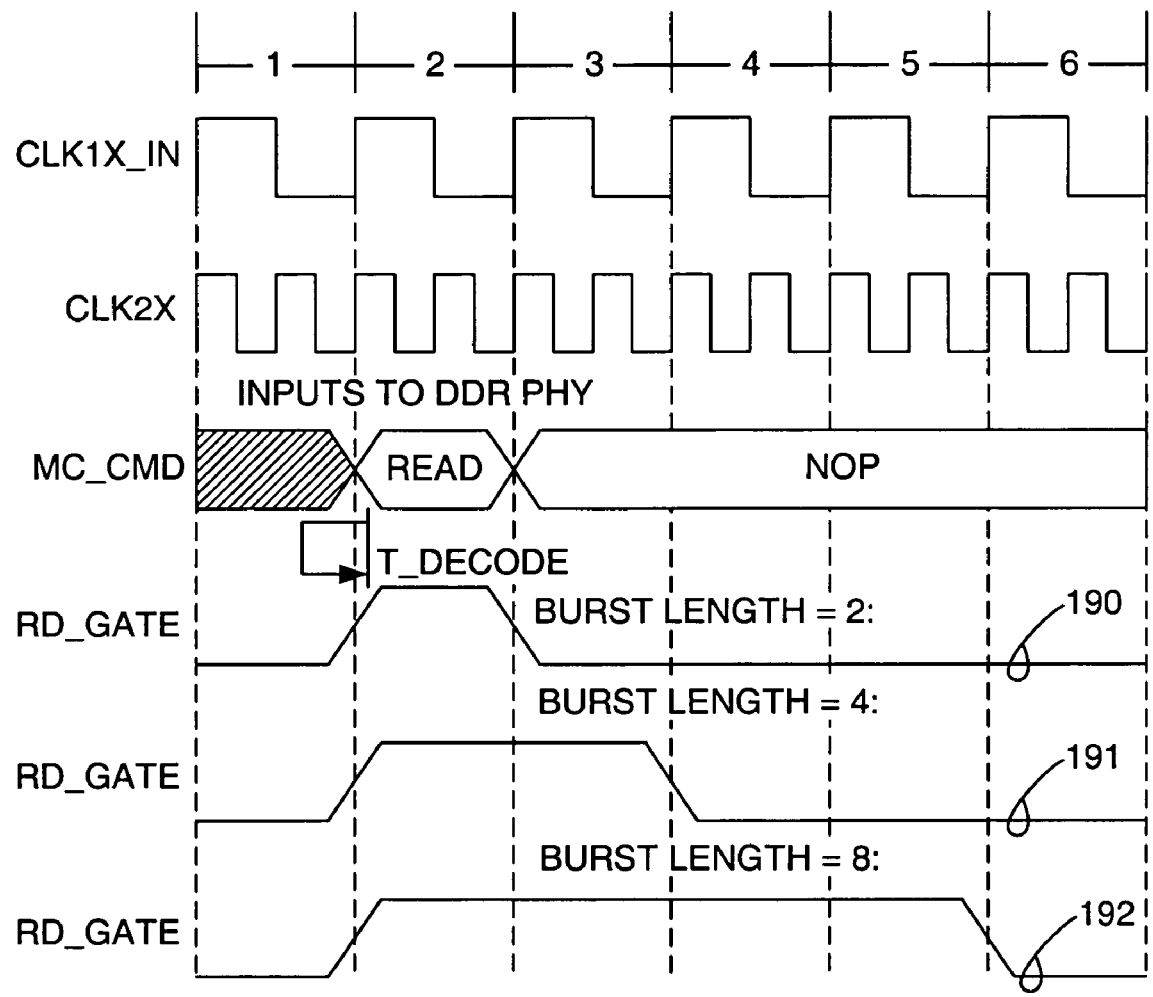
FIG. 6 is a timing diagram illustrating a read gate signal of FIG. 2.

Referring to FIG. 6, a timing diagram is shown illustrating example timing patterns for the signal RD_GATE. The signal RD_GATE gates the signal DQS presented by the circuit 106. Gating the signal DQS prevents invalid states (e.g., when the signal DQS is in a 3-state OFF mode) from being received by the circuit 113. The signal RD_GATE may be used by the physical read datapaths 114 to generate the gating signals GATEON_UN and GATEON_LN. The timing pattern of the signal RD_GATE may be determined by a burst length of a read cycle. For example, when the burst length is two the signal RD_GATE may be generated with a duration of one period of the signal CLK_1X (e.g., trace 190). When the burst length is four the signal RD_GATE may be generated with a duration of two periods of the signal CLK_1X (e.g., trace 191). When the burst length is eight the signal RD_GATE may be generated with a duration of four periods of the signal CLK_1X (e.g., trace 192). The signal RD_GATE may be generated, in one example, by decoding a read command contained in the control signal MC_CMD.

Figure 7:
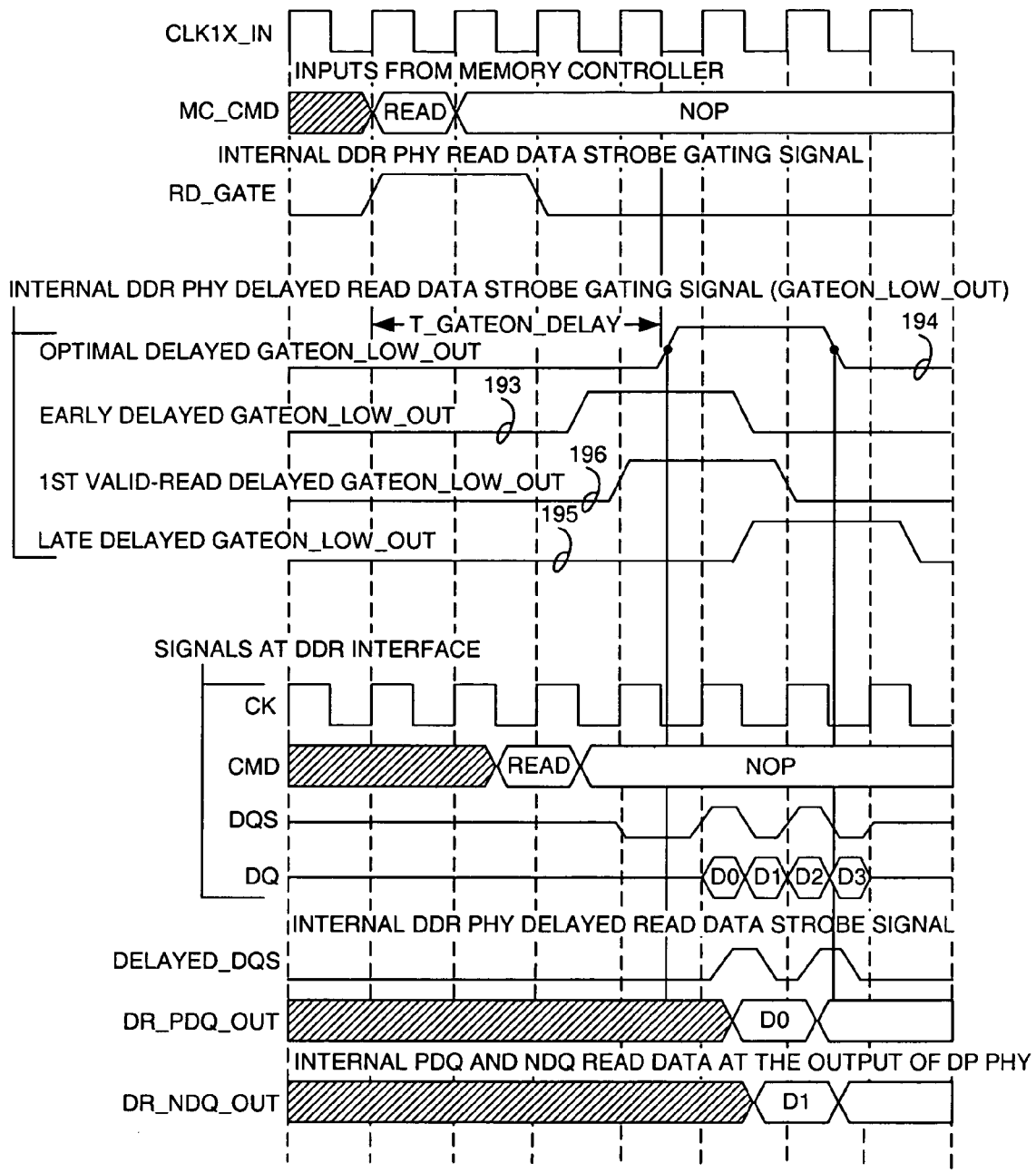
FIG. 7 is a timing diagram illustrating various signals and timing relationships in accordance with the present invention.

Referring to FIG. 7, a timing diagram is shown illustrating examples of gating signal (GATEON) timing with respect to the signal DQS. Examples of the delayed GATEON signal may include an early delayed GATEON, an optimal delayed GATEON and a late delayed GATEON. Early delayed GATEON generally refers to the signal GATEON occurring before the preamble window (e.g., trace 193). The early delayed GATEON signal is generally too early to turn on the read path. The early delayed GATEON signal may result in a false read data strobe DQS signal due to 3-state signaling. Optimal delayed GATEON generally refers to the signal GATEON occurring right in the middle of the preamble window (e.g., trace 194). The optimal delayed GATEON signal may successfully receive all data bytes. Late delayed GATEON generally refers to the signal GATEON occurring too far beyond the preamble window (e.g., trace 195). The late delayed GATEON signal is generally too late to turn on the read path. The late delayed GATEON signal may miss the first read data strobe DQS signal. In general, a calibration process in accordance with the present invention starts with a first valid read delayed GATEON signal (e.g., trace 196) and determines an appropriate delay for generating the optimal delayed GATEON signal.

The signal DQS may be implemented as a bidirectional signal and may be inactive (e.g., 3-stated) when neither the circuit 104 nor the external memory device 106 are active (driving). In order to prevent the possibility of noise entering the circuit 113, the read data strobe signal DQS may be gated into the circuit 113 only when the read data strobe signal DQS is active during a read cycle. In one example, an internal gating signal (e.g., GATEON) brackets (gates) the known-valid states of the read data strobe signal DQS during read cycles. In one example, the signal GATEON may have a default state of LOW. In one example, the gating of the read data strobe signal DQS may be controlled by programming one or more registers with appropriate values. In general, the read data strobe signal DQS path may be gated off when the memory controller 102 is not reading from the memory device(s) 106.

To avoid potential glitches on the DQS line, a delay of the read data strobe signal DQS may only be updated when a read operation is not being performed (e.g., during memory refresh cycles, etc.). Furthermore, the read data FIFOs 112 may be disabled while the delay is being updated. In one example, the following process may be implemented:

1. Disable the FIFOs 112;
2. Update the SLAVE DELAY circuits 124*a*, 124*b*, 128*a* and 128*b*;
3. Reset the FIFOs 112;
4. Enable the FIFOs 112.

In one example, the circuit 104 may be configured to support a number of read data strobe gating schemes. For example, the circuit 104 may support a programmable GATEON scheme, a feedback GATEON scheme and an external GATEON scheme. In general, each of the gating schemes may be configured to compensate for the I/O buffer delays, PCB signal delays, crosspoint skews of the differential clocks (CK/CK#), and CAS latency of the memory device. In one example, the gating scheme may be selectable to best fit the intended application. Due to timing and delay variations, such as I/O buffer delay skews, PCB signal delays, crosspoint skews of differential clocks, memory device CAS latency and access variations, timing of the read GATEON signal may be critical. The GATEON scheme may be implemented to avoid incorrectly asserting or deasserting the signal GATEON at preamble or postamble phases of memory READ cycles.

Referring to FIG. 8, a flow diagram is shown illustrating a read gate timing calibration process 200 in accordance with a preferred embodiment of the present invention. The process 200 may comprise a number of states 202–212. The process 200 may begin by initializing the system 100 for a read gate timing calibration (e.g., block 202). Once the system 100 is initialized, a coarse read gate timing adjustment may be performed (e.g., block 204). Following the coarse read gate timing adjustment, a medium read gate timing adjustment may be performed (e.g., block 206). Following the medium read gate timing adjustment, a fine read gate timing adjustment may be performed (e.g., block 208). Once the coarse, medium and/or fine read gate timing adjustments have been completed, the read gate timing delay may be set based on the coarse, medium and/or fine read gate timing (e.g., block 210). When the read gate timing delay has been set, the process 200 generally ends (e.g., block 212).

The present invention generally provides a systematic process for calibrating the center of a preamble period of a read operation on a double data rate (DDR) synchronous dynamic random access memory (SDRAM) device. The calibration generally enables a gating signal (e.g., the signal GATEON) to be asserted approximately in the middle of the preamble period and to validate an incoming read data strobe signal (e.g., the signal DQS). The validated read data strobe signal may be used to register an incoming read data signal (e.g., the signal DQ). The calibration may be performed without a precise system level SPICE timing analysis.

The process 200 generally starts with a delay setting that asserts the signal GATEON before the preamble window, so that memory read operations fail at the start of the sequence. The GATEON delay is slowly increased (e.g., by changing a value in a register) to determine the first available delay setting that asserts the signal GATEON at or slightly beyond the start of the preamble window (e.g., the trace 196 of FIG. 7). The first available delay setting that asserts the signal GATEON at or slightly beyond the start of the preamble window generally yields read data in the FIFOs 112. The process 200 is generally configured to determine the coarse delay bits first, then the medium delay bits, and then the fine delay bits. Finally, a one-half cycle delay may be added to assert the signal GATEON at about the middle of the preamble window. Asserting the signal GATEON at approximately the middle of the preamble window generally allows sufficient GATEON timing margin for the memory read cycles.

The process 200 may be performed on a per-byte basis (e.g., a single gating signal GATEON for each datapath) or on a per nibble basis (e.g., two gating signals GATEON_UN and GATEON_LN for each datapath) for the entire DDR data width. In one example, the choice may be programmable. In general, performing the process 200 on a per-byte basis rather than a per-nibble basis is less complex. However, performing the process 200 on a per-nibble basis generally allows higher precision. In general, during the adjustment process, comparisons of read and write data are performed on each byte or nibble in the data width. The comparisons are generally referred to herein as a data test.

Figure 9:
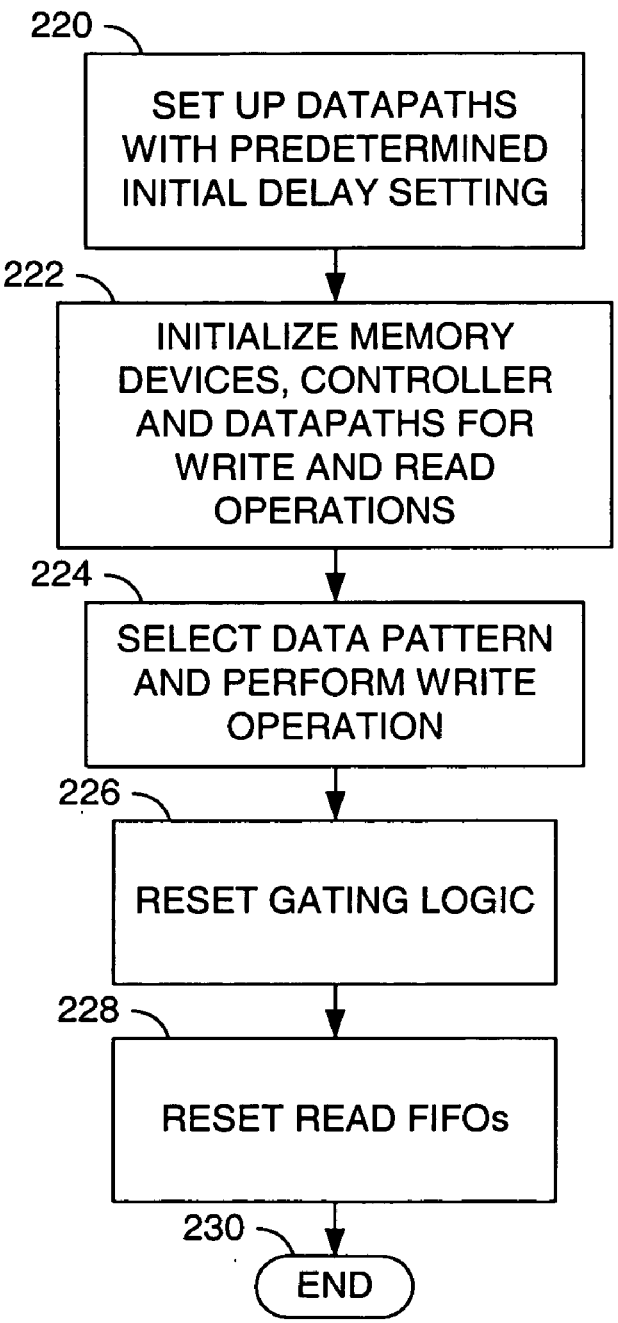
FIG. 9 is a flow diagram of a process in accordance with a preferred embodiment of the present invention.

Referring to FIG. 9, a more detailed flow diagram of the step 202 of FIG. 8 is shown illustrating an initialization process in accordance with a preferred embodiment of the present invention. The process 202 may comprise a number of states 220–230. The process 202 may be implemented in computer executable code that may be run either on the platform ASIC 110 or on a processor on the PCB with the circuits 104, 106 and 108.

At power-up (or reset), a number of steps may be performed prior to calibrating the read gate timing in accordance with the present invention. In one example, a reset signal for the entire platform ASIC 110 may be asserted and deasserted. A reset signal to the circuit 104 may then be asserted. While the reset signal to the circuit 104 remains asserted, a phase locked loop (PLL) configured to generated one or more system clocks (e.g., CLK_1X, CLK_2X, etc.) may be tested for lock. When the PLL is locked, the reset signal to the circuit 104 may be deasserted. A delay lock loop (DLL) implemented as part of the MDELAY circuit 116 may be tested for lock. In one example, a pair of bits may be implemented in one or more control registers of the circuit 116 to indicate whether the DLL in the circuit 116 is locked. Once the DLL is locked, the circuit 104 may be initialized to fit the intended application. In one example, default settings may be implemented to meet the specifications of a number of applications. When the PLL and the DLL are determined to be locked, the DDR SDRAM devices 106 may be initialized.

When the memory devices 106 are initialized, a DQS GATEON delay training process may be executed in accordance with the present invention. In one example, the DQS GATEON delay training process may be implemented for a programmable GATEON delay mode of the circuit 104. In one example, the DQS GATEON delay training process may be implemented as computer executable code that may be run on a processor either (i) mounted on a PCB with the circuit 104–108 or (i) instantiated on the platform ASIC 110.

The process 202 may begin by setting up the DP hardmacros with predetermined initial delay settings configured to assert the signal GATEON before the preamble window (e.g., block 220). In one example the delay settings may be stored in a register. Example delay settings (e.g., the signals SEL_0, SEL_1, SEL_2 and SEL_3) are shown in the following TABLE 1:

TABLE 1

| Bit positions of GATEON Delay Value corresponding to delay steps | CAS Latency | | | | | |
|---|---|---|---|---|---|---|
| | 1.5 | 2 | 2.5 | 3 | 4 | 5 |
| Coarse delay steps bit [7:5] of byte (e.g., SEL_0 and SEL_1) | 000 | 001 | 001 | 010 | 011 | 100 |
| Medium delay steps bit [4:3] of byte (e.g., SEL_2) | 11 | 01 | 11 | 01 | 01 | 01 |
| Fine delay steps bit [2:0] of byte (e.g., SEL_3) | 000 | 000 | 000 | 000 | 000 | 000 |

TABLE 1 generally provides examples of settings for a variety of CAS latencies, to avoid encountering I/O buffer, PCB trace delays, and crosspoint skews of CK/CK#. In one example, the size of the delays steps may be implemented as:

Coarse: one CLK_1X period
Medium: one-quarter CLK_1X period
Fine: 230 picoseconds at nominal PVT In one example, delay settings may be selected that match the CAS latency of a target device. For example, if the CAS latency of the target DDR memory device is 3, then delay settings for CAS latency of 2 are chosen (e.g., 0xb'00101000). The initial delay settings to be used are generally recorded and the DPs initialized with the initial delay settings.

When the datapaths have been set up, the process 202 initializes the memory devices 106, the memory controller 102, and the circuit 104 for memory write and read operations (e.g., block 222). The memory devices are generally initialized with a burst length of 4 and selected CAS latency (in the above example, the CAS latency is 3). The MDELAY circuit 116 is reset and verification performed that the DLL is locked. A check is made to ensure that the memory controller 102 and datapaths 114 are initialized and ready for memory write and read operations.

When the system 100 is ready for memory write and read operations, a unique data pattern is selected and a single memory write (e.g., with a burst length of 4) is executed (e.g., block 224). When the write operation is completed, the gating logic of the datapaths 114 and the asynchronous FIFOs 112 are reset (e.g., blocks 226 and 228). For example, to reset the GATEON logic inside the circuit 104 before starting a memory read, a bit in a control register may be set to a logic HIGH and then cleared to a logic LOW to prepare for memory reads. The asynchronous FIFOs 112 are generally reset to ensure a fresh start of memory reads. In one example, the FIFOs 112 may be reset by setting a self-clearing bit in the control register.

Figure 10:
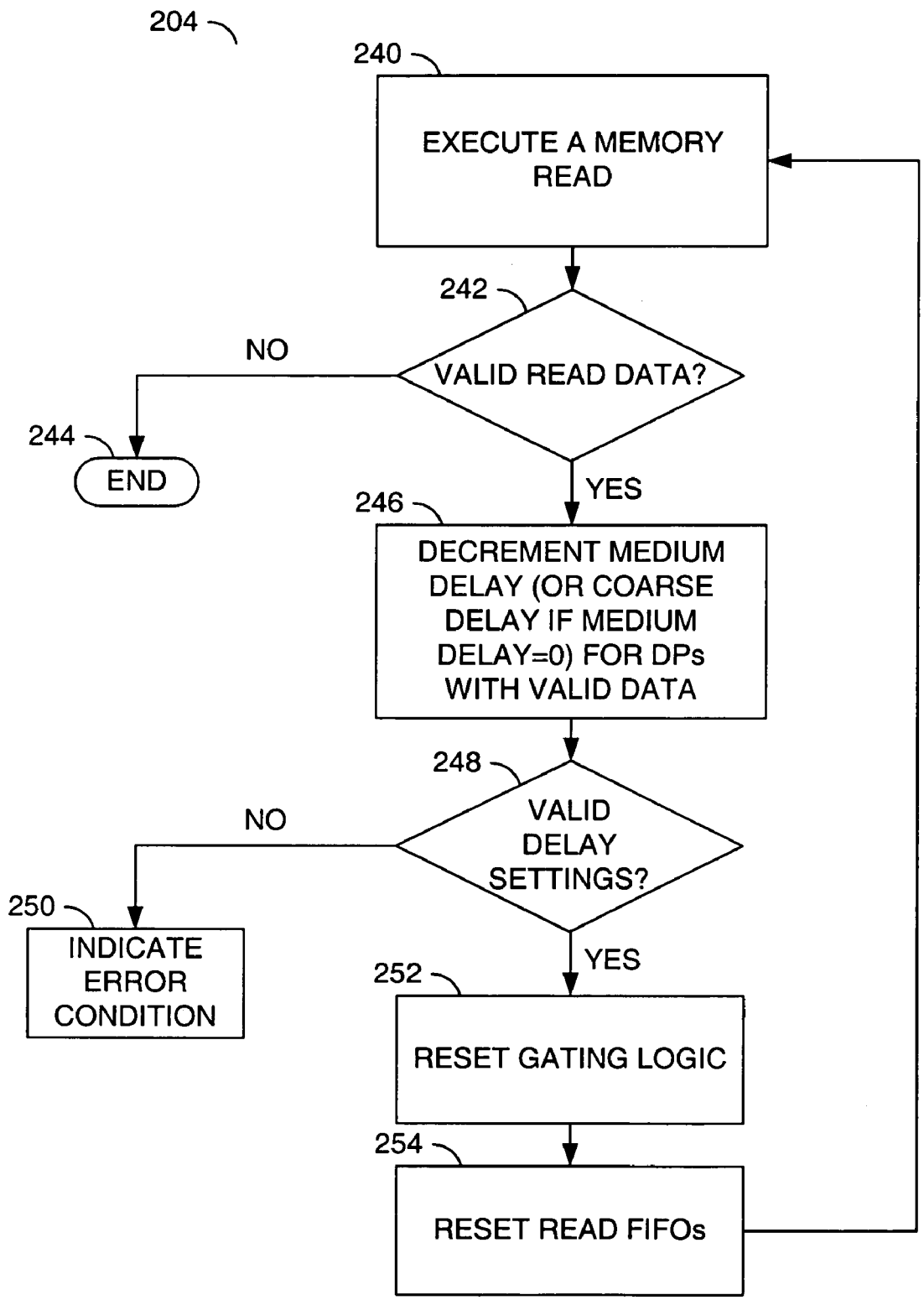
FIG. 10 is a flow diagram of a process in accordance with a preferred embodiment of the present invention.

Referring to FIG. 10, a more detailed flow diagram of the block 204 of FIG. 8 is shown illustrating a coarse read gate timing adjustment (or training) process in accordance with a preferred embodiment of the present invention. The process 204 may comprise a number of states 240–254. The coarse read gate timing adjustment process may begin by executing a memory read (e.g., block 240). A read data test (e.g., comparing data written to memory with data read from memory) may be performed to verify that the written data and the read data are not equal (e.g., block 242). For example, invalid read data may be received when the GATEON delay is set too early. In one example, the data test may comprise checking FIFO status flags (e.g., read data flags) to determine whether valid data is read. For example, four flag bits may be implemented per DP byte of data (e.g., one bit for each positive and negative-edge strobe for each nibble). The FIFO read data flags may be valid or invalid, since the read data may be bad. When the read data is invalid (e.g., the data test fails), the coarse adjustment process is generally terminated (e.g., block 244). If valid data is found in the FIFOs (e.g., the data test passes), the coarse adjustment process generally continues by decrementing the GATEON delay as a troubleshooting technique.

For example, the coarse adjustment procedure may be configured to decrement the medium delay setting by one unit for bytes or nibbles which pass the data test (e.g., block 246). If the medium delay setting is already equal to zero, the coarse delay may be decremented by one unit instead. The delay settings (e.g., coarse, medium, and fine) are generally checked for correctness (e.g., block 248). If all of the delay settings are zero, the training process is stopped for hardware or software troubleshooting (e.g., block 250). When the delay settings are non-zero, the coarse adjustment process may continue the process for determining the first available delay setting for asserting the internal signal GATEON before the preamble window. For example, the coarse adjustment process generally performs the steps of (i) resetting the gating logic (e.g., block 252), (ii) resetting the FIFOs (e.g., block 254) and (iii) executing a memory read and data test (e.g., blocks 240 and 242). The coarse adjustment process is generally repeated until valid data is not received. In general, the iterative process of decrementing the delay and testing the read data generally ensures the read gate signal starts before the preamble window.

Figure 11:
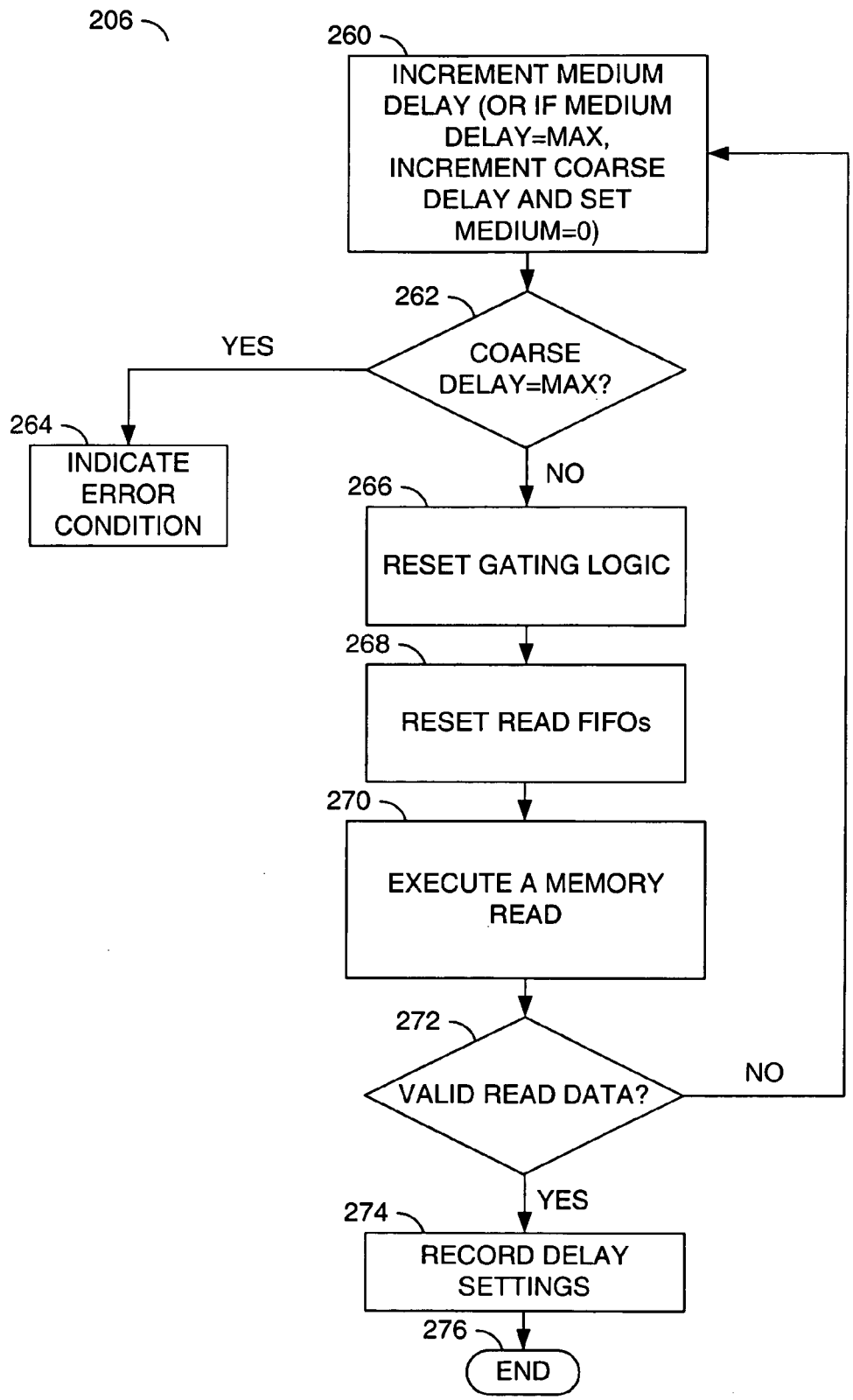
FIG. 11 is a flow diagram of a process in accordance with a preferred embodiment of the present invention.

Referring to FIG. 11, a more detailed flow diagram of the block 206 of FIG. 8 is shown illustrating a medium read gate timing adjustment (or training) process in accordance with a preferred embodiment of the present invention. The process 206 may comprise a number of states 260–276. The process 206 generally begins by incrementing the medium delay settings (e.g., determined by the coarse adjustment process) by one unit (e.g., block 260). If the medium delay settings are at a maximum value, the medium delay setting is generally reset to zero and the corresponding coarse delay setting is incremented by one unit. If the coarse delay setting is at a maximum value (e.g., block 262), the training sequence is stopped for hardware or software troubleshooting (e.g., block 264).

When the coarse delay setting is not at the maximum value, the medium adjustment process generally continues by resetting the gating logic (e.g., block 266) and resetting the FIFOs (e.g., block 268). When the internal GATEON logic inside each DP and READ FIFO circuits are reset, a read data test is executed (e.g., blocks 270 and 272). Since the internal signal GATEON may still be asserted before the preamble window, invalid read data may be found. The medium adjustment process generally repeats the steps 260–272 until valid data is found. In general, as the incrementing sequence continues, the detection of valid data may fail at first, and then pass at some point of incrementing. When valid data is detected (e.g., the YES path from the block 272), the medium adjustment process records the delay settings (e.g., block 274). The recorded settings generally represent the first coarse/medium delay setting that enables a successful memory read, by placing the internal GATEON signal at or beyond the start of the preamble window. After recording the settings the medium adjustment process is generally terminated (e.g., block 276).

Figure 12:
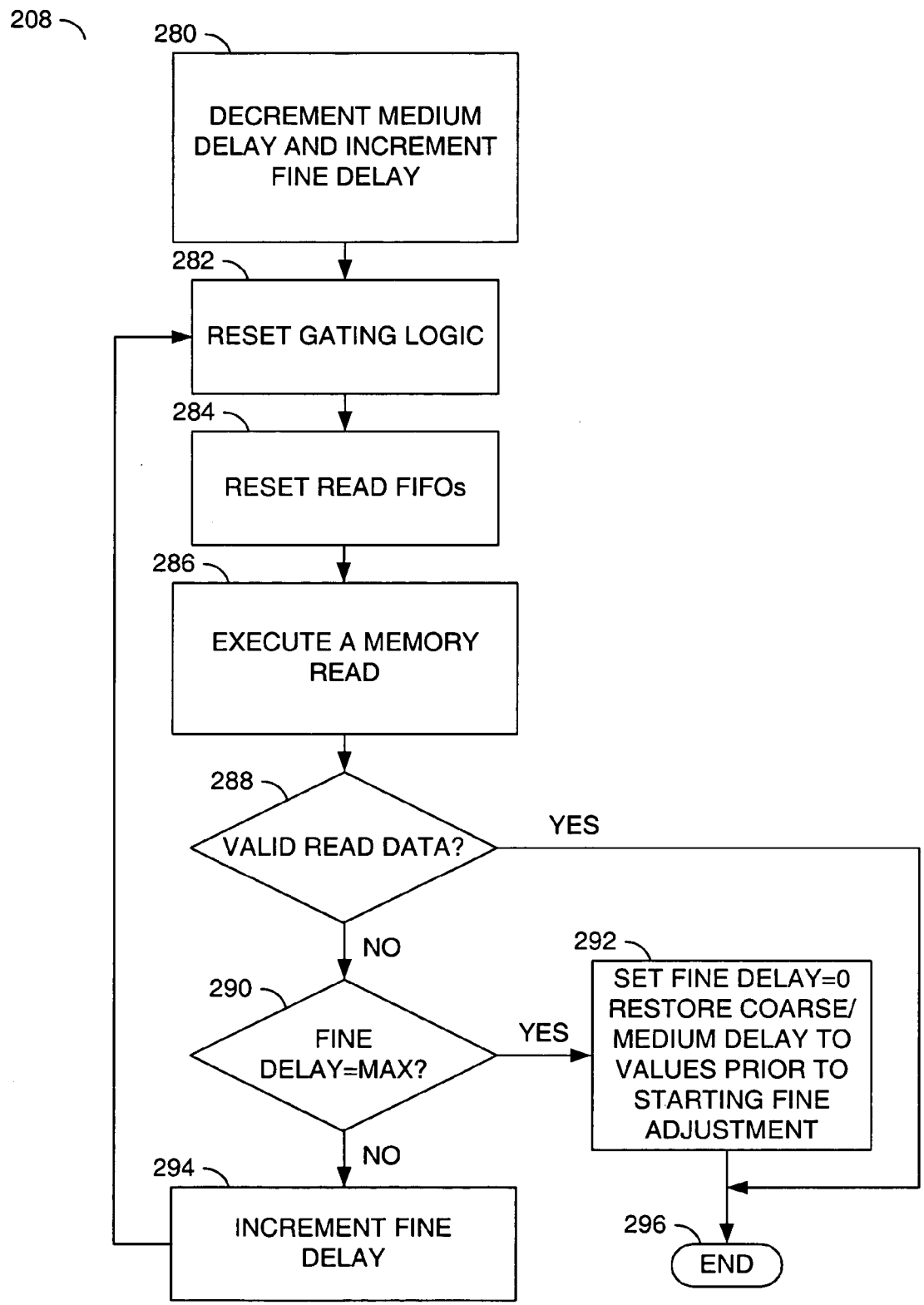
FIG. 12 is a flow diagram of a process in accordance with a preferred embodiment of the present invention.

Referring to FIG. 12, a more detailed flow diagram of the block 208 of FIG. 8 is shown illustrating a fine read gate timing adjustment (or training) process in accordance with a preferred embodiment of the present invention. The fine adjustment process 208 may comprise a number of states 280–296. The fine adjustment process 208 generally begins by decrementing the medium delay setting (e.g., determined by the medium adjustment process) by one unit and incrementing the fine delay setting by one unit (e.g., block 280). The fine adjustment process is generally configured to fine tune the assertion timing of the internal signal GATEON at the start of the preamble window. The fine adjustment process 208 generally continues by (i) resetting the gating logic (e.g., block 282) and (ii) resetting the FIFOs (e.g., block 284) to reset the internal GATEON logic inside each DP and READ FIFO. When the internal GATEON logic inside each DP and READ FIFO is reset, the fine adjustment process executes a memory read and read data test (e.g., blocks 286 and 288).

Initially, invalid data is expected since the medium delay was decremented, making the GATEON delay too early. As the incrementing process of the fine adjustment process proceeds, the data test generally fails at first, and then passes at some point of incrementing. If the fine delay setting is already at a maximum value (e.g., block 290), the fine delay is generally reset to zero and the coarse/medium GATEON delay settings (e.g., determined during the medium adjustment process) are considered to be the best available delay settings for asserting the internal signal GATEON at or slightly beyond the start of the preamble window (e.g., block 292). When the fine delay settings are not at the maximum value, the fine delay is incremented (e.g., block 294). The fine adjustment process (e.g., steps 282–294) is generally repeated until valid data is received. For each byte or nibble, the fine delay settings are generally incremented by one unit. When either (i) the data test passes (e.g., valid data is detected) or (ii) the coarse/medium GATEON delay settings (e.g., determined during the medium adjustment process) are considered to be the best available delay settings for asserting the internal signal GATEON at or slightly beyond the start of the preamble window, the fine adjustment process 208 is generally terminated (e.g., block 296).

Figure 13:
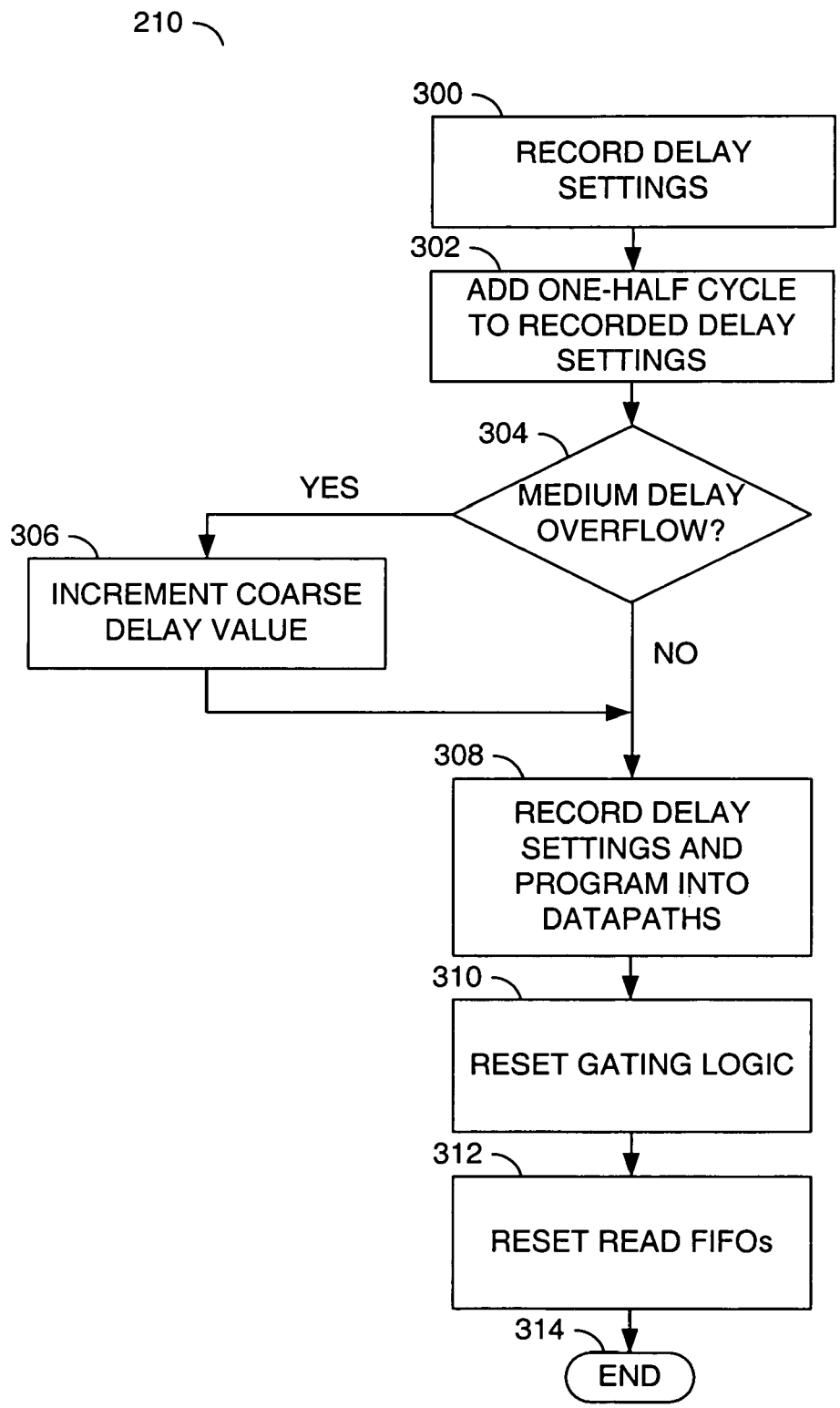
FIG. 13 is a flow diagram of a process in accordance with a preferred embodiment of the present invention.

Referring to FIG. 13, a more detailed flow diagram of the block 210 of FIG. 8 is shown illustrating a gate signal delay setting process in accordance with a preferred embodiment of the present invention. The process 210 may comprise a number of steps 300–314. The process 210 generally begins by recording the delay settings determined during the coarse, medium and fine adjustments steps (e.g., block 300). The recorded settings generally represent the first fine delay settings that enable a successful memory read (e.g., by placing the internal signal GATEON at or slightly beyond the start of the preamble). The process 210 generally continues by determining delay settings for the best placement for the internal signal GATEON (e.g., that yield sufficient timing margin for memory read cycles). For example, the best placement may be obtained by adding a one-half cycle delay to the recorded delay settings (e.g., block 302). In one example, the medium delay setting may be incrementing by two units. If the medium delay setting overflows after the addition (e.g., block 304), the coarse delay is generally incremented by one unit (e.g., block 306).

The adjusted delay settings are recorded (e.g., block 308) and the DP PHYs are set up (or configured) with the adjusted GATEON delay timing settings. For example, the adjusting settings may be programmed into the gateon generating circuit 118. The recorded settings are generally the best available delay settings for placing the GATEON signals close to the middle of the respective preamble. The gating logic is generally reset (e.g., block 310), the FIFOs are reset (e.g., block 312) and the read gate training procedure is generally considered completed (e.g., block 314).

Figure 14:
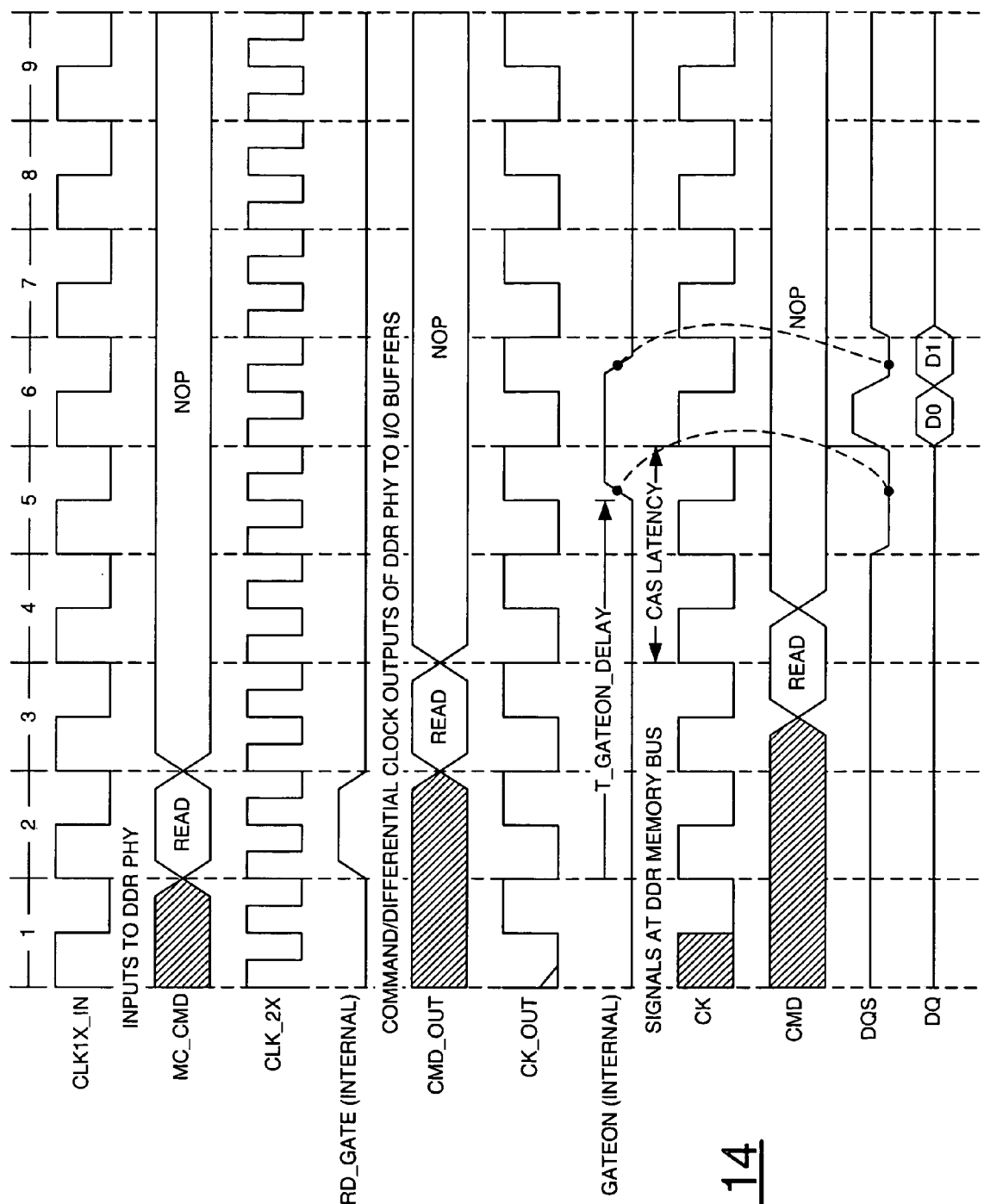
FIG. 14 is a timing diagram illustrating an example of a delayed data strobe gating signal in accordance with a preferred embodiment of the present invention.
Figure 15:
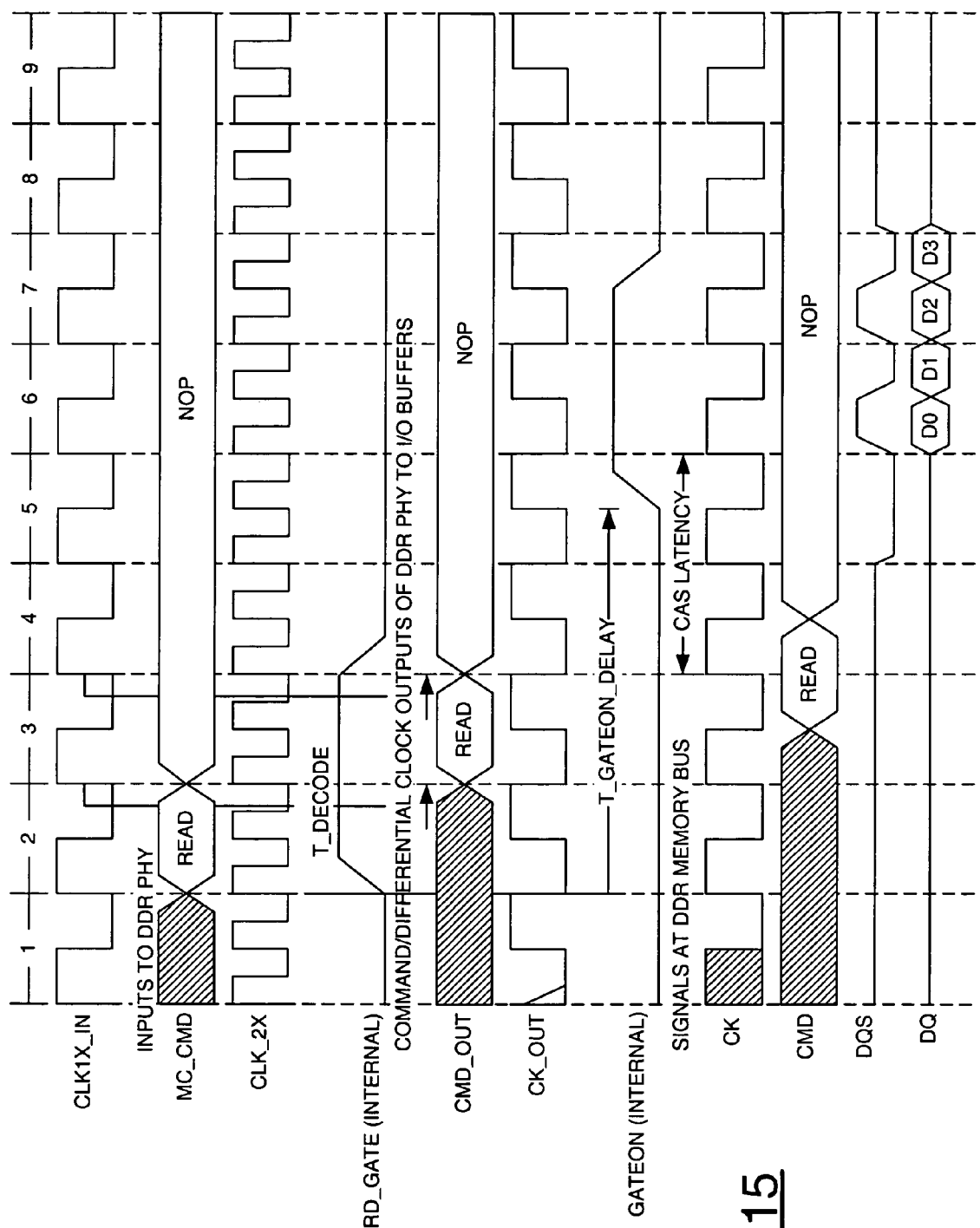
FIG. 15 is a timing diagram illustrating another example of a delayed data strobe gating signal in accordance with a preferred embodiment of the present invention.

Referring to FIGS. 14 and 15, timing diagrams are shown illustrating examples of interface timing generated in accordance with the present invention. The signal RD_GATE is generated based on the burst length (e.g., the number of data words in a read cycle). For example, when the burst length is 2 (e.g., FIG. 14), the signal RD_GATE may have a duration equal to one period of the signal CLK_1X. When the burst length is 4 (e.g., FIG. 15) the signal RD_GATE may have a duration equal to two periods of the signal CLK_1X. The signal RD_GATE may be used by the gateon generating circuit 118 to generate the signal GATEON. The amount of delay between the signal GATEON and the signal RD_GATE may be determined in accordance with the teachings of the present specification, as will be apparent to those skilled in the relevant art(s).

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation. Additionally, inverters may be added to change a particular polarity of the signals.

The function(s) performed by the flow diagrams of FIGS. 8–13 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMs, RAMs, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

The invention claimed is:

1. A method for calibrating read data strobe gating comprising the steps of:
    performing a coarse timing adjustment, wherein a coarse delay setting is determined that produces invalid data;
    performing a medium timing adjustment, wherein a medium delay setting and said coarse delay setting are adjusted until valid data is detected;
    performing a fine timing adjustment, wherein said medium delay setting and a fine delay setting are adjusted until valid data is detected; and
    adding one-half cycle to a gating delay determined by said coarse, said medium and said fine delay settings.

2. The method according to claim 1, wherein said coarse timing adjustment adjusts said gating delay in steps of one clock period.

3. The method according to claim 1, wherein said medium timing adjustment adjusts said gating delay in steps of one-quarter clock period.

4. The method according to claim 1, wherein said fine timing adjustment adjusts said gating delay in steps of a predetermined period of time determined at nominal process, voltage and temperature (PVT).

5. The method according to claim 1, wherein the step of performing said coarse timing adjustment further comprises the sub-steps of:
    performing a memory read;
    determining whether read data is valid;
    decrementing said medium delay setting when said read data is valid; and
    repeating the sub-steps of the coarse timing adjustment until said read data is invalid.

6. The method according to claim 1, wherein the step of performing said medium timing adjustment further comprises the sub-steps of:
    incrementing said medium delay setting;
    performing a memory read;
    determining whether read data is valid;
    repeating the sub-steps of said medium timing adjustment until said read data is valid; and
    recording said medium delay setting, said coarse delay setting and said fine delay setting.

7. The method according to claim 1, wherein the step of performing said fine timing adjustment further comprises the sub-steps of:
    decrementing said medium delay setting;
    incrementing said fine delay setting;
    performing a memory read;
    determining whether read data is valid; and
    repeating the sub-steps of (i) incrementing said fine delay setting, (ii) performing a memory read and (iii) determining whether read data is valid until said read data is valid.

8. The method according to claim 1, wherein the step of adding one-half cycle to said gating delay determined by said coarse, said medium and said fine delay settings further comprises the steps of:
    recording said coarse delay setting, said medium delay setting and said fine delay setting;
    incrementing said medium delay setting by said one-half cycle; and
    incrementing said coarse delay setting by one unit if said medium delay setting overflows.

9. The method according to claim 1, further comprising the step of:
    programming a gating logic using said coarse delay setting, said medium delay setting and said fine delay setting.

10. A computer readable medium having instructions for causing a computer to execute the method according to claim 1.

11. An apparatus comprising:
    a control circuit configured to calibrate a gating delay by (i) performing a coarse timing adjustment, wherein a coarse delay value is determined that produces invalid data, (ii) performing a medium timing adjustment, wherein a medium delay value and said coarse delay value are adjusted until valid data is detected, (iii) performing a fine timing adjustment, wherein said medium delay value and a fine delay value are adjusted until valid data is detected and (iv) adding one-half cycle to said gating delay determined by said coarse, said medium and said fine delay values;

a logic circuit configured to generate a gating signal in response to said gating delay; and a gating circuit configured to gate a read data strobe signal in response to said gating signal.

12. The apparatus according to claim 11, wherein said control circuit is further configured to adjust said coarse delay value in steps of one clock period.

13. The apparatus according to claim 11, wherein said control circuit is further configured to adjust said medium delay value in steps of one-quarter clock period.

14. The apparatus according to claim 11, wherein said control circuit is further configured to adjust said fine delay value in steps of a predetermined period of time determined at nominal process, voltage and temperature (PVT).

15. The apparatus according to claim 11, wherein said control circuit is further configured to:

perform a memory read;

determine whether read data is valid;

decrement said medium delay value when said read data is valid; and repeat the steps of (i) performing a memory read, (ii) determining whether read data is valid and (iii) decrementing said medium delay value when said read data is valid until said read data is invalid.

16. The apparatus according to claim 11, wherein said control circuit is further configured to:

increment said medium delay value;

perform a memory read;

determine whether read data is valid;

repeat the steps of (i) incrementing said medium delay value, (ii) performing a memory read and (iii) determining whether read data is valid until said read data is valid; and record said medium delay value, said coarse delay value and said fine delay value.

17. The apparatus according to claim 11, wherein said control circuit is further configured to:

decrement said medium delay value;

increment said fine delay value;

perform a memory read;

determine whether read data is valid; and repeat the steps of (i) incrementing said fine delay value, (ii) performing a memory read and (iii) determining whether read data is valid until said read data is valid.

18. The apparatus according to claim 11, wherein said control circuit is further configured to program said logic circuit using said coarse delay value, said medium delay value and said fine delay value.

19. The apparatus according to claim 11, wherein said control circuit is further configured to (i) add said one-half cycle to said gating delay by incrementing said medium delay value by two units and (ii) if incrementing the medium delay setting causes an overflow, incrementing the coarse delay value by one unit.

20. An apparatus comprising:

means for performing a coarse timing adjustment, wherein a coarse delay value is determined that produces invalid data;

means for performing a medium timing adjustment, wherein a medium delay value and said coarse delay value are adjusted until valid data is detected;

means for performing a fine timing adjustment, wherein said medium delay value and a fine delay value are adjusted until valid data is detected; and means for adding one-half cycle to a gating delay determined by said coarse, said medium and said fine delay values.

* * * * *